US012622195B2

(12) United States Patent
Chetry et al.

(10) Patent No.: US 12,622,195 B2
(45) Date of Patent: May 5, 2026

(54) METHODS FOR POLISHING BULK SILICON DEVICES

(71) Applicant: Qorvo US, Inc., Greensboro, NC (US)

(72) Inventors: Krishna Chetry, Richardson, TX (US); Ganesan Radhakrishnan, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 240 days.

(21) Appl. No.: 18/217,694

(22) Filed: Jul. 3, 2023

(65) Prior Publication Data

US 2024/0096636 A1     Mar. 21, 2024

Related U.S. Application Data

(60) Provisional application No. 63/376,463, filed on Sep. 21, 2022.

(51) Int. Cl.
H10P 52/40     (2026.01)
B24B 7/22     (2006.01)
B24B 37/34     (2012.01)

(52) U.S. Cl.
CPC ............ H10P 52/402 (2026.01); B24B 7/228 (2013.01); B24B 37/34 (2013.01)

(58) Field of Classification Search
CPC ......... H01L 21/30625; H01L 21/02024; H01L 21/02041; H01L 21/304; B24B 7/228; B24B 37/34; B24B 9/065; B24B 37/02
USPC .................................................. 438/690–693
See application file for complete search history.

(56) References Cited

U.S. PATENT DOCUMENTS

| | | | |
|---|---|---|---|
| 5,366,924 A | 11/1994 | Easter et al. | |
| 6,849,548 B2 | 2/2005 | Cooper | |
| 7,419,946 B2 * | 9/2008 | Hiraoka ................. | B24B 57/02 |
| | | | 438/692 |
| 10,312,128 B2 | 6/2019 | Lin | |

(Continued)

FOREIGN PATENT DOCUMENTS

| | | | |
|---|---|---|---|
| CN | 102208486 A | 10/2011 | |
| CN | 103700677 B * | 9/2016 | ......... H01L 27/1464 |

(Continued)

OTHER PUBLICATIONS

Extended European Search Report for European Patent Application No. 23196997.3, mailed Feb. 19, 2024, 8 pages.

*Primary Examiner* — Duy Vu N Deo
(74) *Attorney, Agent, or Firm* — Withrow & Terranova, P.L.L.C.

(57) ABSTRACT

Methods for polishing bulk silicon are disclosed. In one aspect, mechanical polishing is facilitated by cyclically alternating between a silicon reactive slurry and deionized water while a mechanical polishing head operates on a surface. In exemplary aspects, the polishing head is polishing a bulk silicon carrier wafer to expose a backside of a radio frequency (RF) complementary metal oxide semiconductor (CMOS) switch, although other semiconductors may also benefit from exemplary aspects of the present disclosure. While the silicon slurry is present, a reaction between the bulk silicon and the slurry takes place allowing the polishing head to remove the bulk silicon. The deionized water interrupts this reaction and helps prevent overpolishing which might otherwise damage the device.

16 Claims, 9 Drawing Sheets

(56)         References Cited

U.S. PATENT DOCUMENTS

|  |  |  |  |
|---|---|---|---|
| 10,665,494 B2 | 5/2020 | Kumar et al. | |
| 2003/0109200 A1 | 6/2003 | Hall et al. | |
| 2003/0190810 A1 | 10/2003 | Cooper | |
| 2010/0081279 A1 | 4/2010 | Palmer et al. | |
| 2010/0178766 A1* | 7/2010 | Andry | H01L 21/76898 |
| | | | 438/692 |
| 2010/0258528 A1* | 10/2010 | Singh | C09G 1/02 |
| | | | 451/36 |
| 2013/0256910 A1 | 10/2013 | Lee et al. | |
| 2015/0364387 A1* | 12/2015 | Cho | H01L 21/02016 |
| | | | 438/8 |
| 2017/0309494 A1* | 10/2017 | Osterheld | H01L 21/3212 |
| 2019/0010356 A1* | 1/2019 | Singh | B24B 37/00 |
| 2022/0052667 A1 | 2/2022 | Carpenter et al. | |

FOREIGN PATENT DOCUMENTS

|  |  |  |  |  |
|---|---|---|---|---|
| CN | 114520185 A * | 5/2022 | ....... | H01L 21/76224 |
| DE | 102013213839 A1 * | 1/2015 | ....... | H01L 21/02024 |
| EP | 0357205 A1 | 3/1990 | | |
| KR | 100728887 B1 | 6/2007 | | |

* cited by examiner

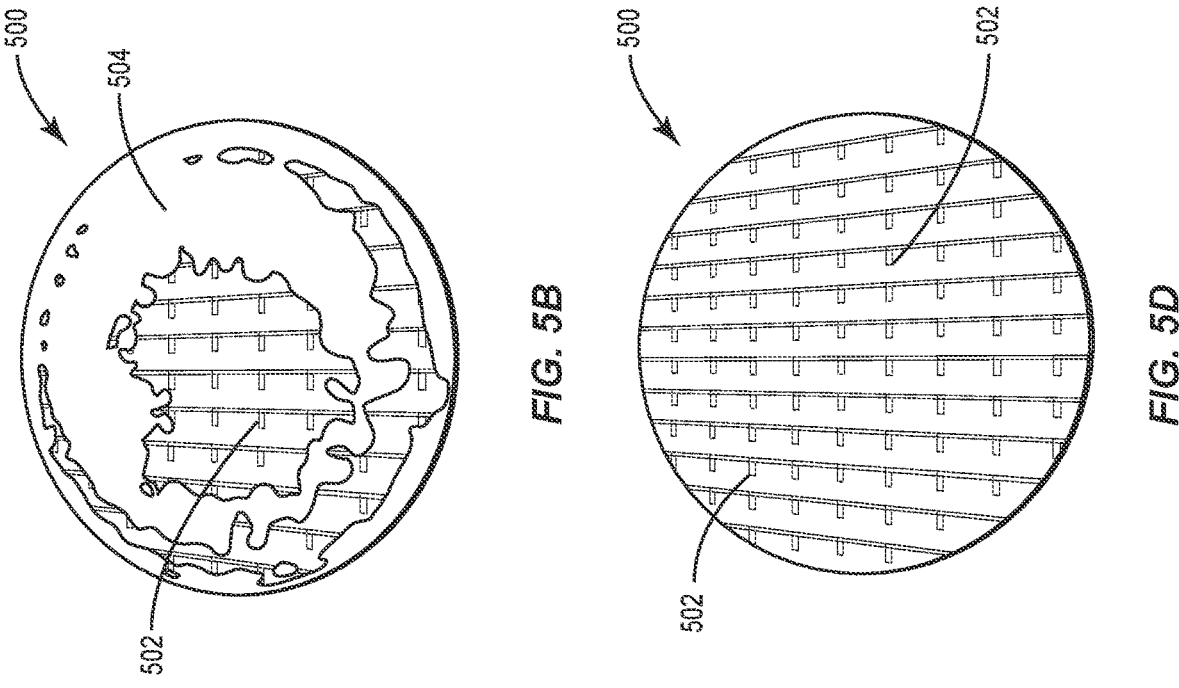
FIG. 5A
FIG. 5B
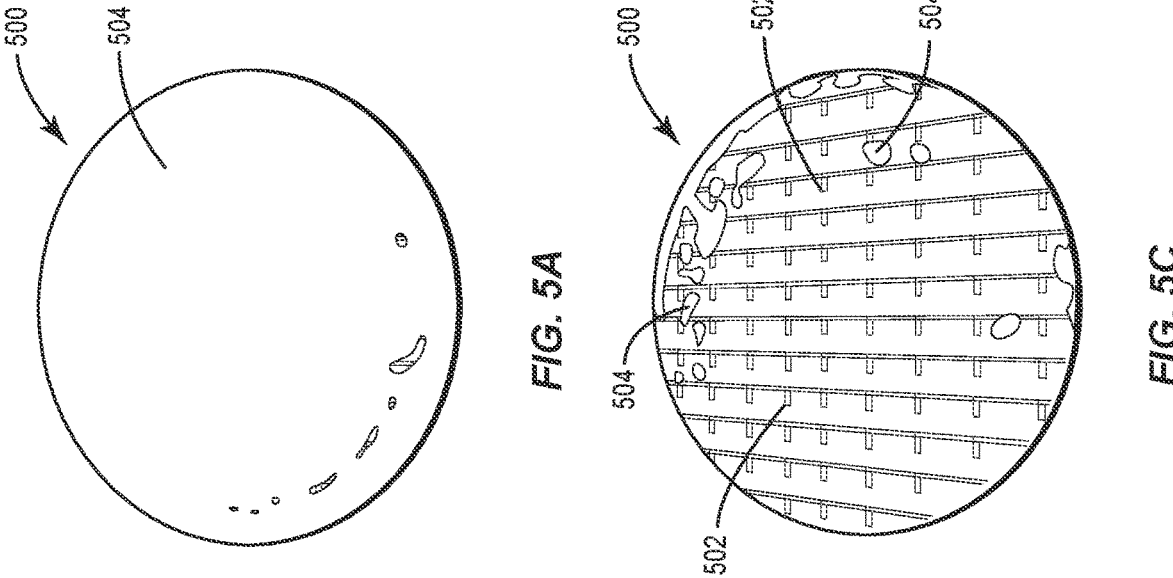
FIG. 5C
FIG. 5D

METHODS FOR POLISHING BULK SILICON DEVICES

PRIORITY APPLICATION

This application claims the benefit of U.S. Provisional Patent Application Ser. No. 63/376,463, filed on Sep. 21, 2022, the disclosure of which is hereby incorporated herein by reference in its entirety.

BACKGROUND

I. Field of the Disclosure

The technology of the disclosure relates generally to semiconductor manufacturing techniques and more particularly to polishing silicon wafers.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. The evolution of computing devices is driven in large part by advances in the semiconductor technologies used to create integrated circuits capable of providing such functions. Commercial pressures to minimize power consumption, reduce size, reduce cost, or increase processing power continue to provide room for innovation in this space.

SUMMARY

Aspects disclosed in the detailed description include methods for polishing bulk silicon devices. In particular, mechanical polishing is facilitated by cyclically alternating between a silicon-reactive slurry and deionized water while a mechanical polishing head operates on a surface. In exemplary aspects, the polishing head is polishing a bulk silicon carrier wafer to expose a backside of a radio frequency (RF) complementary metal oxide semiconductor (CMOS) switch, although other semiconductors may also benefit from exemplary aspects of the present disclosure. While the silicon slurry is present, a reaction between the bulk silicon and the slurry takes place allowing the polishing head to remove the bulk silicon. The deionized water interrupts this reaction and helps prevent overpolishing of thin silicon layers (e.g., in trench areas) which might otherwise damage the device.

In this regard in one aspect, a method for exposing a device for backside processing is disclosed. The method comprises polishing the device with a silicon slurry and a polishing head. The method also comprises rinsing the device with deionized water to remove the silicon slurry.

In another aspect, a method for exposing a device for backside processing is disclosed. The method comprises polishing a backside of a device having a thin device layer by running a continuous cycle of reactive silicon slurry and deionized water.

In another aspect, a mobile terminal comprising an integrated circuit comprising a device formed from the method for exposing a device for backside processing is disclosed.

The method comprises polishing the device with a silicon slurry and a polishing head. The method also comprises rinsing the device with deionized water to remove the silicon slurry.

BRIEF DESCRIPTION OF THE DRAWINGS

FIGS. 5A-5D show top planned views of a semiconductor wafer after various numbers of cycles of the present disclosure.

DETAILED DESCRIPTION

Figure 1A:
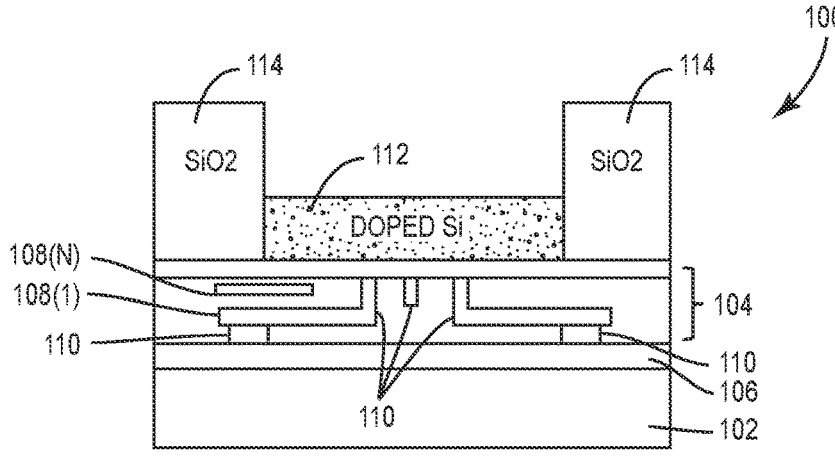
FIG. 1A is a cross-sectional elevation view of a semiconductor device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include methods for polishing bulk silicon devices. In particular, mechanical polishing is facilitated by cyclically alternating between a silicon-reactive slurry and deionized water while a mechanical polishing head operates on a surface. In exemplary aspects, the polishing head is polishing a bulk silicon carrier wafer to expose a backside of a radio frequency (RF) complementary metal oxide semiconductor (CMOS) switch, although other semiconductors may also benefit from exemplary aspects of the present disclosure. While the silicon slurry is present, a reaction between the bulk silicon and the slurry takes place allowing the polishing head to remove the bulk silicon. The deionized water interrupts this reaction and helps prevent overpolishing of thin silicon layers (e.g., in trench areas) which might otherwise damage the device.

Figure 1B:
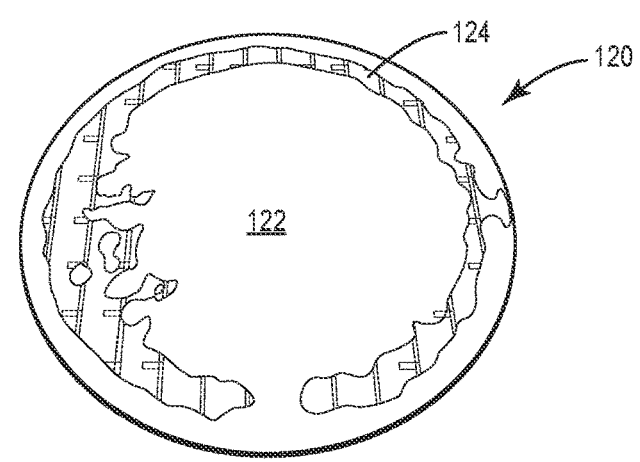
FIG. 1B is a top plan view of a semiconductor wafer subjected to traditional chemical mechanical polishing (CMP) steps.
Figure 1C:
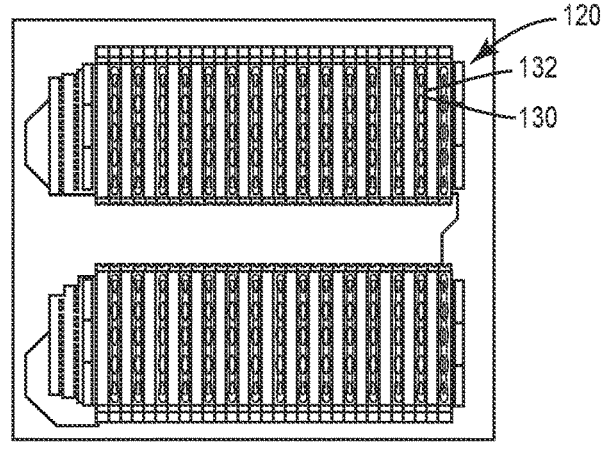
FIG. 1C is a top plan view of damaged doped silicon devices in the semiconductor wafer of FIG. 1B.

Before addressing exemplary aspects of the present disclosure, a brief review of some of the limitations and concerns for traditional processes are provided with reference to FIGS. 1A-1C. A discussion of exemplary aspects of the present disclosure begins below with reference to FIG. 2.

FIG. 1A is a cross-sectional side elevation view of a semiconductor device 100 that may have a carrier wafer 102 attached to a metallization layer 104 by an adhesive 106. The metallization layer 104 may have metal layers 108(1)-108 (N) (only two shown) therein coupled by vias 110, which provide options for coupling external pads or contacts (not shown) to elements (e.g., gates, sources, drains within transistors) within a doped silicon material 112. Silicon oxide ($SiO_2$) insulators 114 may provide barriers between different transistors or the like.

Traditionally, the semiconductor device 100 may have been mounted on a silicon on insulator (SoI) carrier. The insulator material in the SoI carrier provides for desired performance characteristics without the need for further processing (e.g., backside chemical mechanical polishing (CMP)). SoI materials are, as of this writing, somewhat scarce, with only two major suppliers to meet the global need. Further, SoI materials are relatively expensive. This combination of factors makes it desirable to move to a different carrier.

One such alternative carrier is a bulk silicon substrate. However, to achieve the same performance, there must generally be some backside processing for devices mounted on or formed from bulk silicon substrates. When bulk silicon is processed to reveal the backside, such as through a CMP process, it is not uncommon for irregularities in the silicon to cause uneven polishing as better seen in FIG. 1B, where a wafer 120 has residual silicon 122 covering portions of the wafer 120 while already having exposed portions 124. In general, the wafer 120 will be subjected to additional polishing until the residual silicon 122 has been fully removed. As better seen in FIG. 1C, such over polishing will result in damage 130 (i.e., the ovals) to devices 132 on the wafer 120.

Exemplary aspects of the present disclosure provide an improved polishing process that alternately polishes and rinses the wafer to interrupt a chemical reaction, thereby slowing or preventing the polishing of portions of the wafer with comparatively thin silicon coverings. More specifically, a chemical reaction more readily starts on thicker silicon, and thus, by controlling how long a silicon slurry is present on the silicon during polishing, it is possible to control what thicknesses of silicon are polished, leaving thinner silicon portions unreacted with the slurry and thus unpolished.

Figure 2:
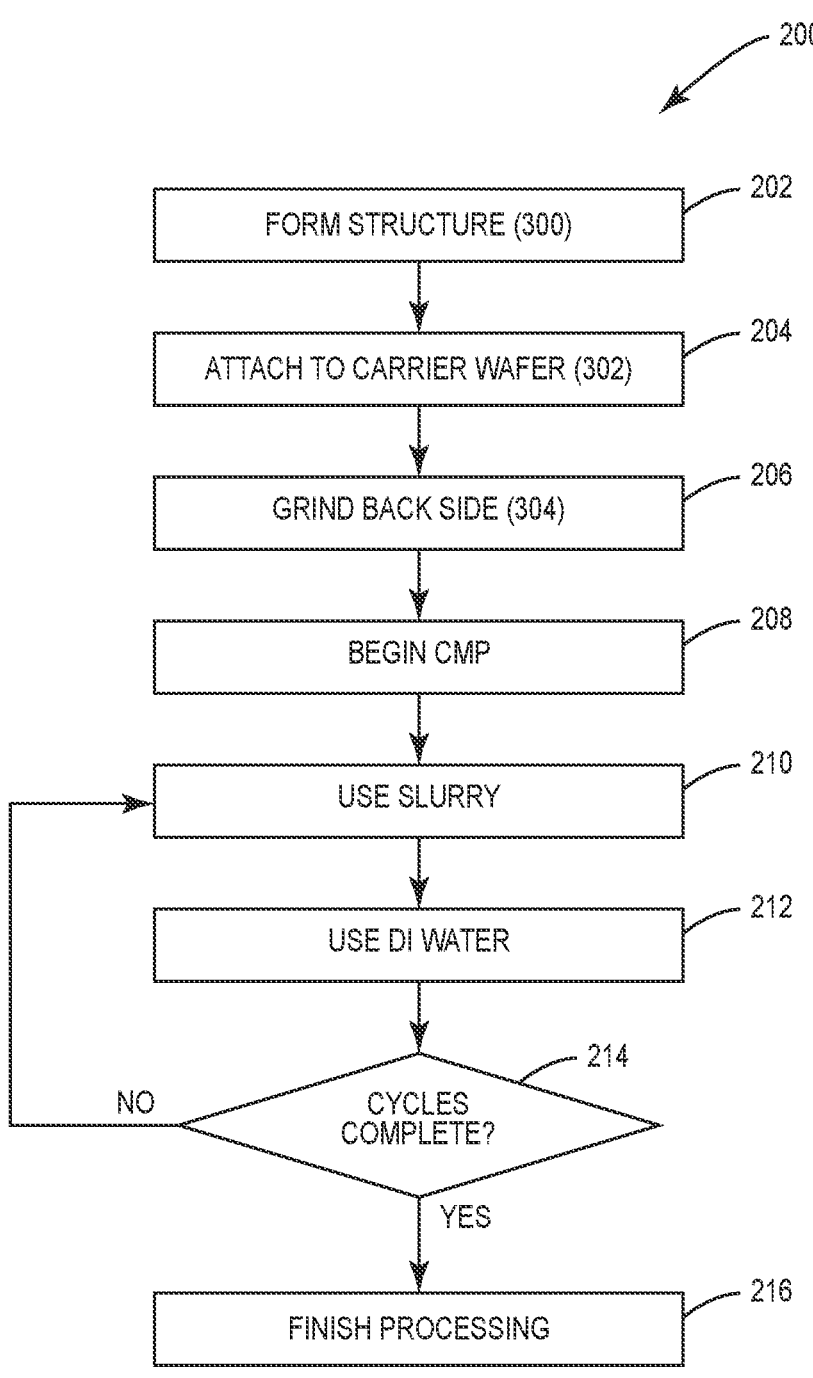
FIG. 2 is a flowchart illustrating an exemplary process for polishing semiconductor wafers according to exemplary aspects of the present disclosure.

In this regard, FIG. 2 is a flowchart of a process 200 according to exemplary aspects of the present disclosure. FIGS. 3A-3D show various steps of the process 200 and are referred to as the process 200 is explained.

The process 200 begins by forming a device or structure 300 in bulk silicon (block 202). The bulk silicon may have an initial thickness of, for example, 770 micrometers (µm). Formation may include doping portions of the silicon to create insulators, gates, drains, sources, channels, or the like. The structure 300 is then attached to a carrier wafer 302 (block 204, see FIG. 3A). Note that the active elements of the structure 300 are adjacent to the carrier wafer 302 and the opposite side may be considered a backside. That is, the structure 300 may include a backside 304 formed from unused silicon material 306. The process 200 continues by grinding away a portion of the backside 304 (block 206). This grinding may trim the unused silicon material 306 to approximately 5-10 µm (see FIG. 3B). Of note is that the grinding step of block 206 does not expose any of the active elements of the structure 300.

The process 200 continues by beginning CMP (block 208) by initially using a silicon slurry that is chemically reactive with the silicon material 306 (block 210) for a predefined amount of time and then purging or rinsing the backside 304 using deionized (DI) water (block 212). As better seen in FIGS. 3E and 3F, the CMP may be done using a polishing head 330 that rotates on a rotating polishing pad 332. The silicon slurry may be applied by opening a valve 334 to put the silicon slurry on the polishing pad 332 for a first amount of time 336 (i.e., block 210). At block 212, the valve 334 is closed and a valve 338 is opened to allow the DI water to rinse the silicon slurry off the polishing pad 332 for a second amount of time 340. Together, the times 336 and 340 form a single cycle 342. In an exemplary aspect, the valves 334, 338 may be pneumatic valves.

With continued reference to FIG. 2, a control system (not shown) may determine if a predetermined number of cycles have been completed (block 214). If the answer to block 214 is no, then the process 200 returns to another slurry and rinse cycle (i.e., returns to block 210, see FIG. 3C). If, however, the answer to block 214 is yes, then the process 200 concludes with any additional processing (block 216, see FIG. 3D).

Exemplary aspects of the present disclosure control how much of the unused silicon material 306 is removed by controlling how long the silicon slurry is reacting with the unused silicon material 306 before the rinsing with the DI water. That is, as better seen in FIG. 3G, curve 350 corresponds to relatively thick unused silicon material 306A. Because of the thickness of the unused silicon material 306A, curve 350 reflects a short incubation period 352. That is, the unused silicon material 306A begins reacting with the silicon slurry relatively quickly, and polishing by the polishing head 330 is able to remove some portion of the silicon. In contrast, the relatively thin unused silicon material 306B is slower to react to the silicon slurry and has a corresponding longer incubation period 354 shown by curve 356. By choosing a slurry time 358 corresponding to time 336 at a time before the incubation period of a particular thickness occurs, the present disclosure can cause no reaction and no polishing of thicknesses less than the thickness corresponding to the slurry time 358. That is, each curve on the graph corresponds to a particular thickness (and there are many curves not shown), so choosing a slurry time 358 at a specific point allows all thicknesses with curves having incubation times less than the slurry time to be polished and all thicknesses with curves having incubation times greater than the slurry time to be unreacted and thus unpolished.

Figure 3B:
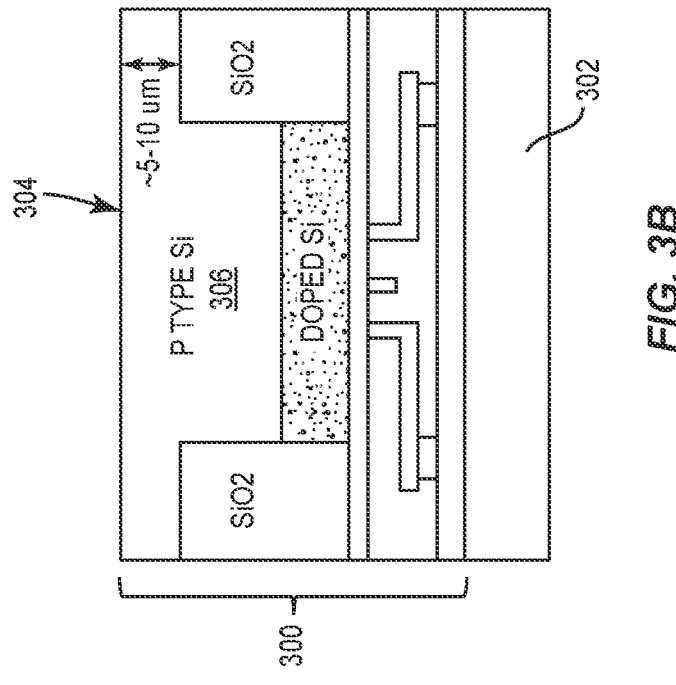
FIGS. 3A-3D are cross-sectional elevation views showing the steps of the process of FIG. 2.
Figure 3A:
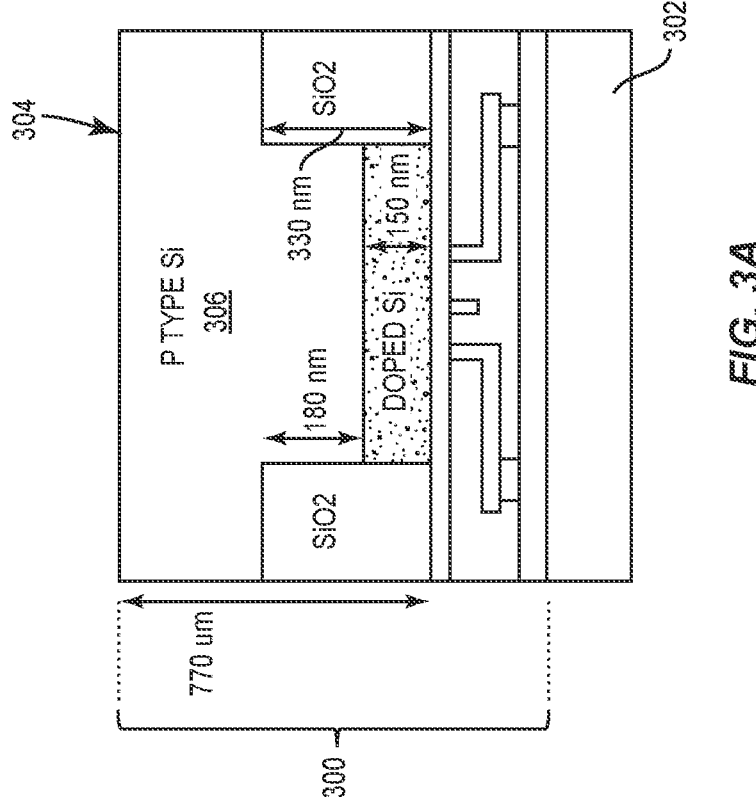
Figure 3D:
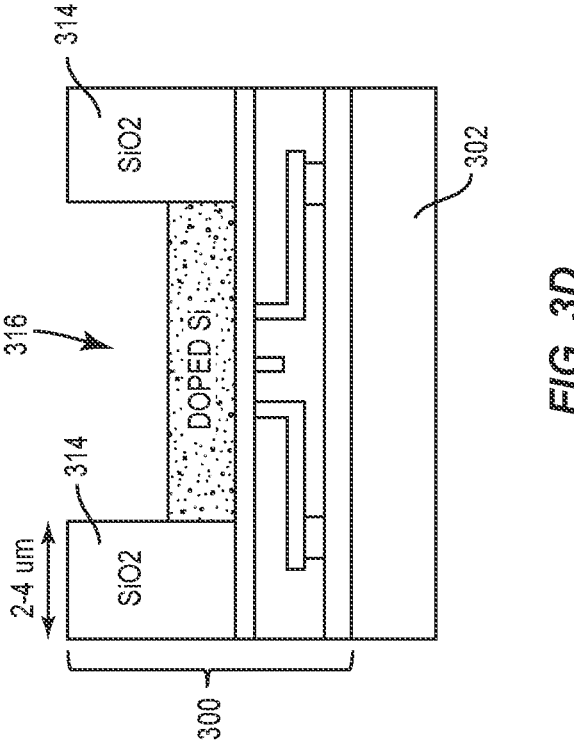
Figure 3C:
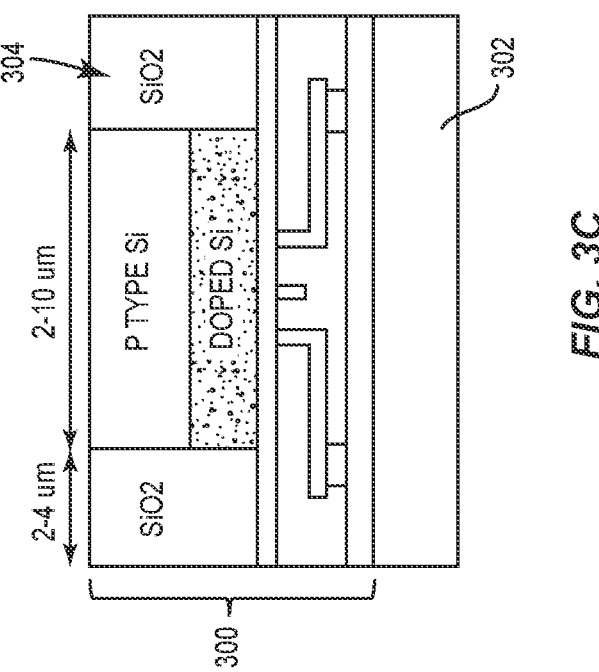
Figure 3F:
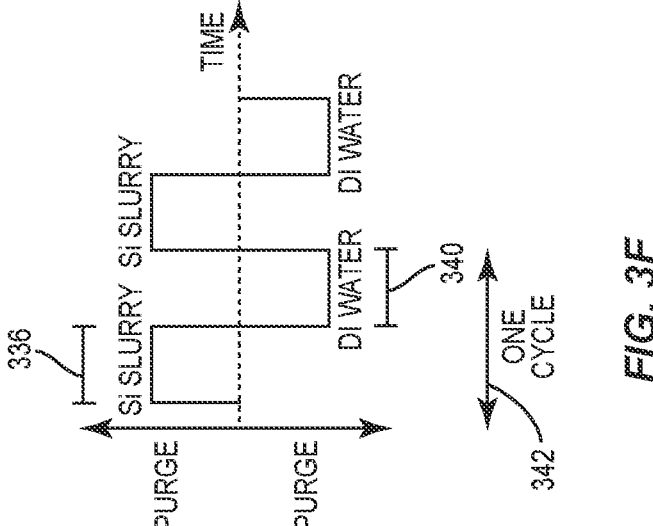
FIG. 3F is a graph showing the cyclical process of alternating slurry and deionized water according to the process of FIG. 2.
Figure 3E:
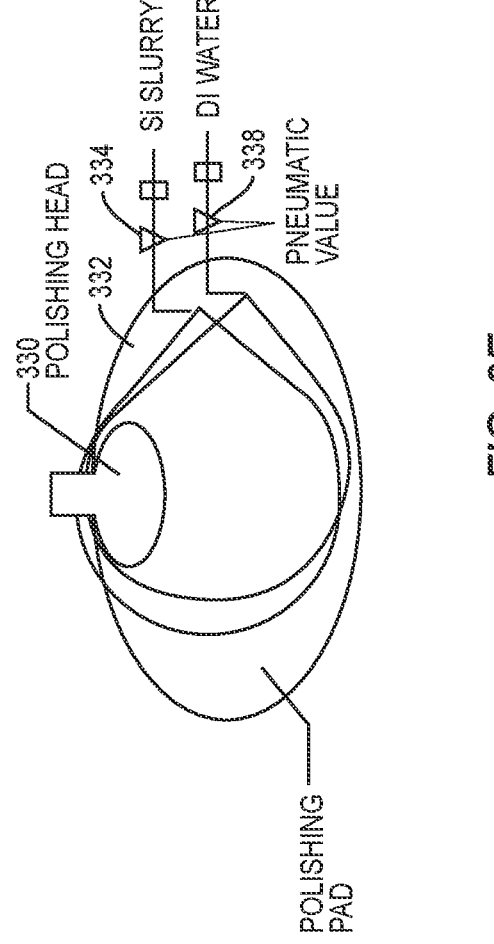
FIG. 3E is a stylized representation of a polishing tool that may be used in the process of FIG. 2.
Figure 3G:
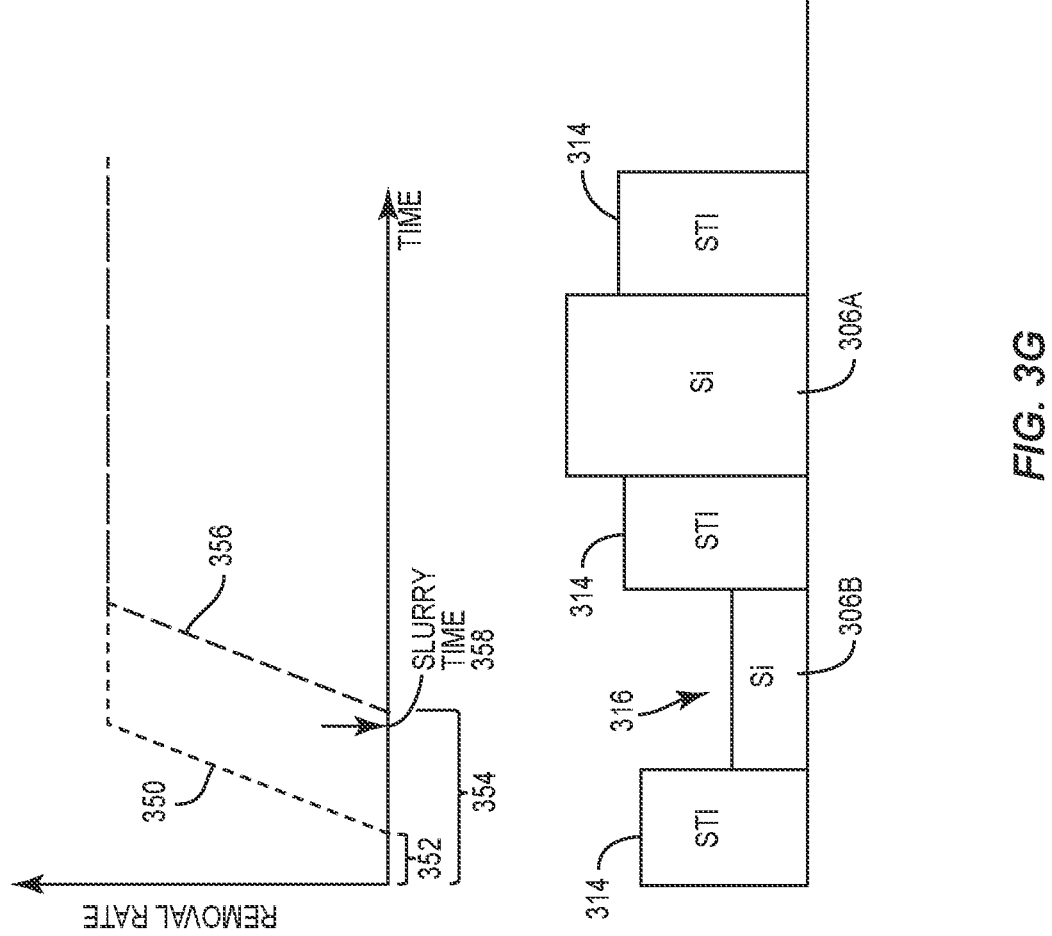
FIG. 3G is a time versus removal rate graph showing how incubation period varies by thickness of silicon along with a cross-sectional view of a wafer having different thicknesses corresponding to the curves on the graph.
Figure 4:
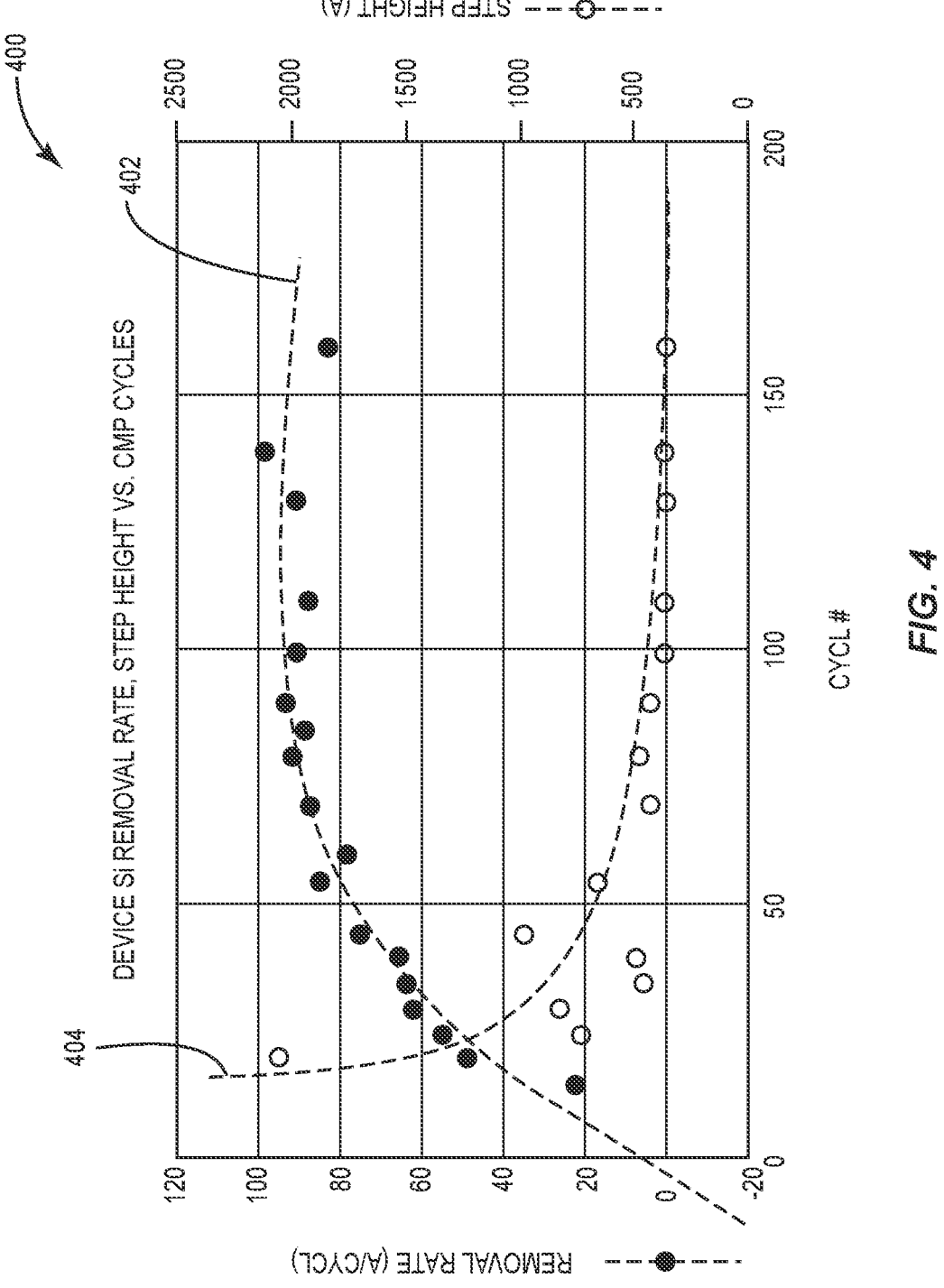
FIG. 4 is a graph showing the rate of removal compared to cycles juxtaposed with a height of a silicon material showing how interruption of the chemical reaction allows for a softer polishing of a semiconductor wafer.

By virtue of selecting an appropriate slurry time 358, the process 200 avoids polishing the silicon oxide insulators 314 while polishing out a trench 316 (see FIGS. 3C, 3D). A graph 400 in FIG. 4 may provide an alternate view of how the incubation time works. When the silicon is thick (i.e., little or no step height (curve 402)), the rate of removal is high (i.e., fast, see curve 404). As the number of cycles increases (the x-axis), the step height increases, but the rate of removal decreases. Empirically, the silicon slurry can react with thick silicon faster than with thin silicon allowing thicker silicon to be removed by the polishing head 330 more readily. It takes the silicon slurry longer to react with the thin silicon and, since the second portion of time 340 has the silicon slurry removed by rinsing with the DI water, there is not enough time for a large reaction to occur. The net effect of this is that the removal of thin silicon atop the silicon oxide insulators 314 is stopped when the thickness of the silicon is decreased past the incubation period. Conversely, the thicker silicon in the trench 316 is removed more readily so long as this silicon in the trench 316 has a thickness with an incubation period less than the slurry time 358. Accordingly, damage to the structure 300 is averted. The precise thickness of silicon left after the polishing is determined by selection of the slurry time 358.

Exemplary photos of a test silicon wafer 500 are shown after various numbers of cycles in FIGS. 5A-5D. Specifically, in FIG. 5A, after five cycles, the silicon material 306 is still being removed. After twenty cycles, shown in FIG. 5B, some silicon has been completely removed exposing devices 502, but leaving some silicon 504. After thirty-five cycles, shown in FIG. 5C, most of the silicon 504 is gone. Finally, after three hundred forty-five cycles, shown in FIG. 5D, any unwanted silicon 504 is gone, leaving a predetermined thickness remaining corresponding to the thickness selected by the slurry time 358. Testing showed that the devices 502 were not damaged.

Further testing shows that by selecting appropriate slurry reactants and by properly adjusting slurry flow, DI water flow, duty cycle, cycle time and other process parameters, the silicon can be removed with a precise control atomic layer-by-atomic layer.

Figure 6:
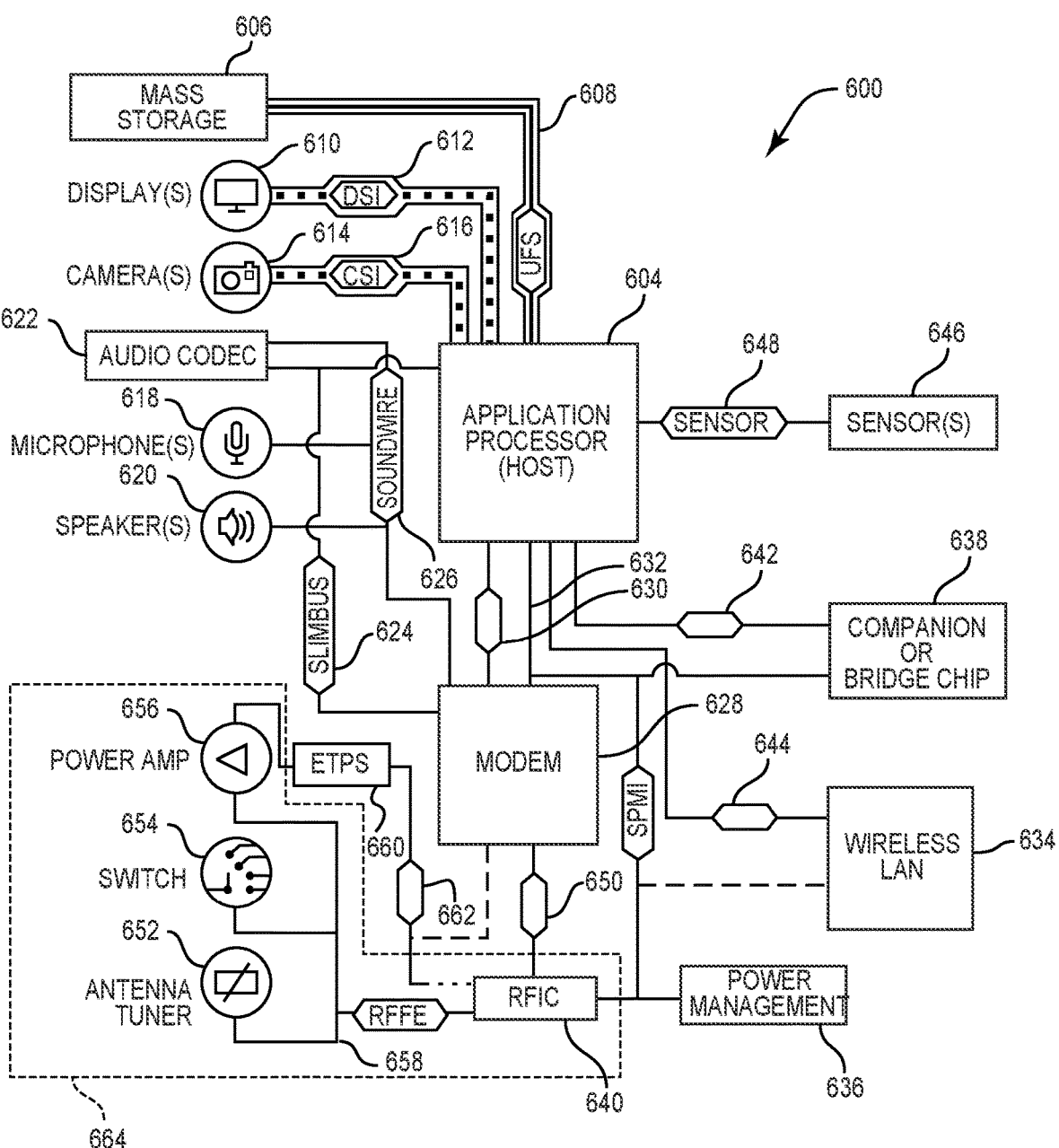
FIG. 6 is a block diagram of a mobile computing device which may include a semiconductor device made according to exemplary aspects of the present disclosure.

In this regard, FIG. 6 is a system-level block diagram of an exemplary mobile terminal 600 such as a smartphone, mobile computing device tablet, or the like. Exemplary aspects of the present disclosure are well suited for construction of integrated circuits such as RF switches or couplers that operate in a mobile terminal 600.

With continued reference to FIG. 6, the mobile terminal 600 includes an application processor 604 (sometimes referred to as a host) that communicates with a mass storage element 606 through a universal flash storage (UFS) bus 608. The application processor 604 may further be connected to a display 610 through a display serial interface (DSI) bus 612 and a camera 614 through a camera serial interface (CSI) bus 616. Various audio elements such as a microphone 618, a speaker 620, and an audio codec 622 may be coupled to the application processor 604 through a serial low-power interchip multimedia bus (SLIMbus) 624. Additionally, the audio elements may communicate with each other through a SOUNDWIRE bus 626. A modem 628 may also be coupled to the SLIMbus 624 and/or the SOUND-WIRE bus 626. The modem 628 may further be connected to the application processor 604 through a peripheral component interconnect (PCI) or PCI express (PCIe) bus 630 and/or a system power management interface (SPMI) bus 632.

With continued reference to FIG. 6, the SPMI bus 632 may also be coupled to a local area network (LAN or WLAN) IC (LAN IC or WLAN IC) 634, a power management integrated circuit (PMIC) 636, a companion IC (sometimes referred to as a bridge chip) 638, and a radio frequency IC (RFIC) 640. It should be appreciated that separate PCI buses 642 and 644 may also couple the application processor 604 to the companion IC 638 and the WLAN IC 634. The application processor 604 may further be connected to sensors 646 through a sensor bus 648. The modem 628 and the RFIC 640 may communicate using a bus 650.

With continued reference to FIG. 6, the RFIC 640 may couple to one or more RFFE, elements, such as an antenna tuner 652, which may include an IC formed according to exemplary aspects of the present disclosure, a switch 654, and a power amplifier 656 through a radio frequency front end (RFFE) bus 658. Additionally, the RFIC 640 may couple to an envelope tracking power supply (ETPS) 660 through a bus 662, and the ETPS 660 may communicate with the power amplifier 656. Collectively, the RFFE elements, including the RFIC 640, may be considered an RFFE system 664. It should be appreciated that the RFFE bus 658 may be formed from a clock line and a data line (not illustrated).

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A method for exposing a semiconductor device for backside processing, the method comprising:

providing the semiconductor device comprising a trench delimited by insulator sidewalls;

grinding away a portion of a backside of the semiconductor device;

selecting a slurry time based on a desired thickness of silicon to be removed from the backside of the semiconductor device, where the slurry time corresponds to an incubation period between a silicon slurry and silicon on the backside of the semiconductor device;

polishing the backside of the semiconductor device with the silicon slurry and a polishing head such that silicon in the trench is removed at a pace faster than any silicon between the insulator sidewalls and the backside; and rinsing the semiconductor device with deionized water to remove the silicon slurry and interrupt the reaction between the silicon slurry and the silicon.

2. The method of claim 1, further comprising repeating the polishing and rinsing for multiple cycles.

3. The method of claim 1, wherein polishing the semiconductor device with the polishing head comprises rotating the polishing head.

4. The method of claim 3, wherein polishing the semiconductor device comprises rotating a polishing pad.

5. The method of claim 1, further comprising initially forming a structure of the semiconductor device in bulk silicon.

6. The method of claim 5, wherein polishing the semiconductor device removes a portion of the bulk silicon.

7. The method of claim 5, wherein forming the structure comprises forming a complementary metal oxide semiconductor.

8. The method of claim 5, wherein forming the structure comprises forming a radio frequency switch comprising a plurality of transistors.

9. The method of claim 5, further comprising adhering the structure to a carrier wafer.

10. The method of claim 1, further comprising opening a valve to apply the silicon slurry.

11. The method of claim 1, further comprising opening a valve to apply the deionized water.

12. The method of claim 1, further comprising timing the rinsing relative to the polishing a single atomic layer is removed.

13. The method of claim 1, wherein polishing comprises avoiding polishing the insulator sidewalls.

14. The method of claim 1, wherein a step height of removal approaches a steady state during polishing.

15. The method of claim 1, wherein the rate of removal during polishing approaches zero.

16. A method for exposing a semiconductor device for backside processing, the method comprising:

providing the semiconductor device comprising a trench delimited by insulator sidewalls; and polishing silicon out of the trench while avoiding polishing the insulator sidewalls by setting an incubation time for a silicon slurry used during polishing, such that when the silicon in the trench, a rate of removal approaches zero while a step height approaches a steady state value.

* * * * *